United States Patent
Civay et al.

(10) Patent No.: US 9,530,689 B2
(45) Date of Patent: Dec. 27, 2016

(54) METHODS FOR FABRICATING INTEGRATED CIRCUITS USING MULTI-PATTERNING PROCESSES

(71) Applicant: GLOBALFOUNDRIES, INC., Grand Cayman (KY)

(72) Inventors: Deniz Elizabeth Civay, Clifton Park, NY (US); Jason Eugene Stephens, Albany, NY (US); Jiong Li, Clifton Park, NY (US); Guillaume Bouche, Albany, NY (US); Richard A. Farrell, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/684,949

(22) Filed: Apr. 13, 2015

(65) Prior Publication Data

US 2016/0300754 A1    Oct. 13, 2016

(51) Int. Cl.
*H01L 21/768* (2006.01)

(52) U.S. Cl.
CPC ..... *H01L 21/7688* (2013.01); *H01L 21/76802* (2013.01); *H01L 21/76831* (2013.01)

(58) Field of Classification Search
CPC ............ H01L 45/1675; H01L 21/31144; H01L 21/76811
See application file for complete search history.

(56) References Cited

U.S. PATENT DOCUMENTS

| | | | | |
|---|---|---|---|---|
| 2006/0046201 A1* | 3/2006 | Sandhu | ............... | H01L 21/0337 430/314 |
| 2006/0046422 A1* | 3/2006 | Tran | .................... | H01L 21/0337 438/401 |
| 2006/0211260 A1* | 9/2006 | Tran | .................... | H01L 21/0337 438/763 |
| 2011/0076845 A1* | 3/2011 | Tsai | .................. | H01L 21/31144 438/618 |
| 2014/0284813 A1* | 9/2014 | Greco | ............... | H01L 21/76811 257/774 |
| 2015/0339422 A1* | 11/2015 | Greco | ................. | G06F 17/5068 438/702 |

* cited by examiner

*Primary Examiner* — Jaehwan Oh

(74) *Attorney, Agent, or Firm* — Lorenz & Kopf, LLP

(57) ABSTRACT

Methods for fabricating integrated circuits are provided. One method includes decomposing a master pattern layout for a semiconductor device layer that includes a target metal line with a target interconnecting via/contact into a first sub-pattern and a second sub-pattern. The target metal line is decomposed into a first line feature pattern that is part of the first sub-pattern and a second line feature pattern that is part of the second sub-pattern such that the first and second line feature patterns have overlapping portions defining a stitch that corresponds to the target interconnecting via/contact. A first photomask is generated that corresponds to the first sub-pattern. A second photomask is generated that corresponds to the second sub-pattern.

12 Claims, 8 Drawing Sheets

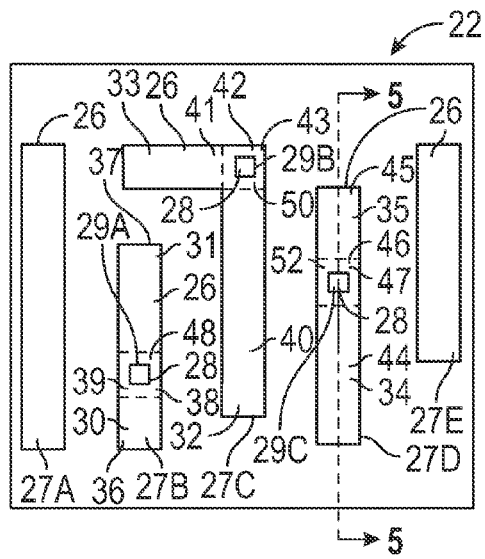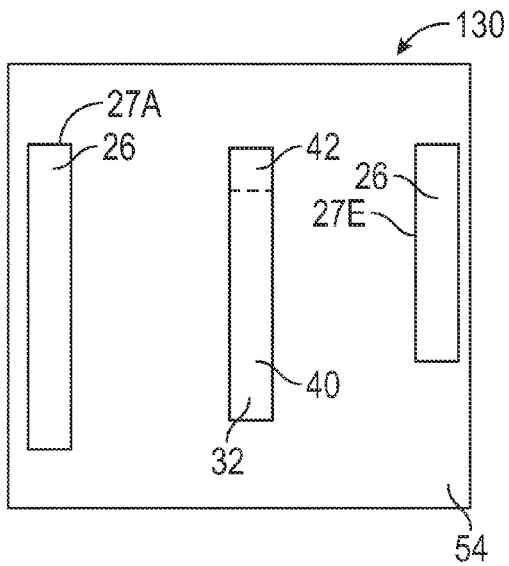
FIG. 3    FIG. 4A
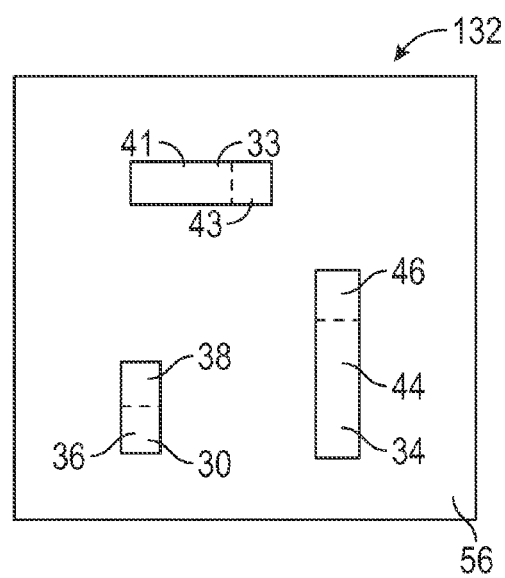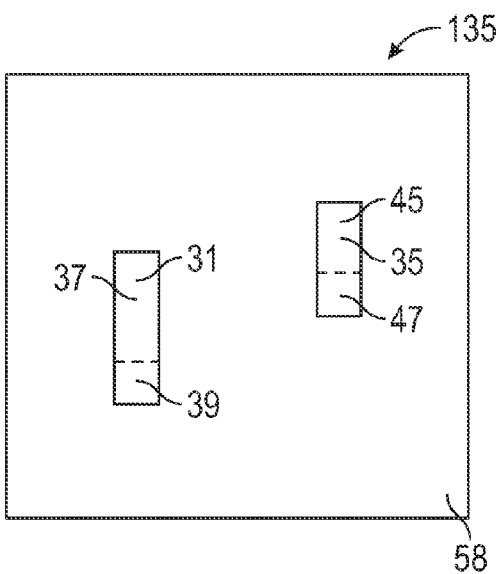
FIG. 4B    FIG. 4C

METHODS FOR FABRICATING INTEGRATED CIRCUITS USING MULTI-PATTERNING PROCESSES

TECHNICAL FIELD

The technical field relates generally to methods for fabricating integrated circuits, and more particularly relates to methods for fabricating integrated circuits using multi-patterning processes for forming, for example, metal lines and interconnecting vias and/or interconnecting contacts.

BACKGROUND

There is a continuing trend within the microelectronics industry to incorporate more circuitry having greater complexity on a single integrated circuit (IC) chip. Maintaining this trend generally entails shrinking the size of individual devices within the circuit by reducing the critical dimensions (CDs) of device elements along with the pitch, or the CD of such an element added to the spacing between elements. Microlithography tooling and processing techniques play an important role in resolving the features necessary to fabricate devices and, accordingly, are continually under development to meet industry milestones relating to the CD and pitch characteristics of each new technology generation.

High numerical aperture (NA) 193 nanometer (nm) optical projection stepper/scanner systems in combination with advanced photoresist processes are now capable of routinely resolving complex patterns that include isolated and dense resist features having CDs and pitches, respectively, well below the exposure wavelength. However, to meet the requirements of device design rules, which continue to push the resolution limits of existing processes and tooling, other more specialized techniques have been developed to further enhance resolution. These include multi-patterning processes in which device patterns having potentially optically unresolvable features are decomposed into two or more complementary, and more easily resolvable patterns, each containing features with larger CDs and/or a relaxed pitch.

ICs typically include a plurality of semiconductor devices formed above and/or on a semiconductor substrate and interconnect wiring. Networks of metal interconnect wiring are often used to connect the semiconductor devices. The networks of metal interconnect wiring generally include multiple layers (e.g., a metallization layers) of metal lines that are interconnected by conductive vias. The various semiconductor device layers of the IC can include, for example, the networks of metal interconnect wiring above a semiconductor substrate and can also include the semiconductor devices that are above and/or on the semiconductor substrate. The metal lines and/or semiconductor devices in adjacent semiconductor device layers are electrically connected through the interconnect vias (or interconnect contacts for example to the semiconductor devices) and various semiconductor device layers are stacked to form, for example, an interconnect structure that can include or is contacted to a front-end-of-the-line ("FEOL") including the individual semiconductor devices (e.g., transistors, capacitors, resistors, and the like) on the semiconductor substrate and/or that can include a back-end-of-the-line ("BEOL") interconnect structure including the networks of metal interconnect wiring above the semiconductor substrate. Within such a structure, for example, metal lines run parallel to the substrate and conductive vias and/or conduct contacts run perpendicular to the semiconductor substrate between the metal lines and/or semiconductor devices to interconnect the adjacent semiconductor device layers.

A master pattern layout for the semiconductor device layer may include, for example, target metal lines (e.g., design details for metal lines) for the semiconductor device layer and the target interconnecting via/contacts (e.g., design details for interconnecting via and/or interconnecting contacts) for interconnecting the target metal lines with an underlying semiconductor device layer (e.g., an underlying metallization layer) or an underlying semiconductor device(s). Typically, multi-patterning processes decompose the target metal lines in a semiconductor device layer into two or more complementary and more easily resolvable patterns that are transferred to corresponding photomasks and at least one additional pattern that is transferred to a separate photomask(s) for the target interconnecting via/contacts. However, cost and process efficiency are impacted by the number of photomasks required for a given multi-patterning process.

Accordingly, it is desirable to provide methods for fabricating integrated circuits using multi-patterning processes that reduce the total number of photomasks compared to conventional multi-patterning approaches. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided herein. In accordance with an exemplary embodiment, a method for fabricating an integrated circuit includes decomposing a master pattern layout for a semiconductor device layer that includes a target metal line with a target interconnecting via/contact into a first sub-pattern and a second sub-pattern. The target metal line is decomposed into a first line feature pattern that is part of the first sub-pattern and a second line feature pattern that is part of the second sub-pattern such that the first and second line feature patterns have overlapping portions defining a stitch that corresponds to the target interconnecting via/contact. A first photomask is generated that corresponds to the first sub-pattern. A second photomask is generated that corresponds to the second sub-pattern.

In accordance with another exemplary embodiment, a method for fabricating an integrated circuit is provided. The method includes patterning a first hard mask layer overlying a dielectric layer of dielectric material that overlies a semiconductor substrate using a first photomask to transfer a first line feature pattern from the first photomask to the first hard mask layer to form a first patterned hard mask layer. The first patterned hard mask layer has a first line feature opening formed therethrough that corresponds to the first line feature pattern and that exposes a first portion of the dielectric layer. A photoresist layer is deposited overlying the first patterned hard mask layer including overlying the first portion of the dielectric layer. The photoresist layer is patterned using a second photomask to transfer a second line feature pattern from the second photomask to the photoresist layer to form a patterned photoresist layer. The patterned photoresist layer has a second line feature opening formed therethrough that corresponds to the second line feature pattern. Patterning the photoresist layer includes forming the patterned photoresist layer such that the first and second line feature openings partially overlap to expose a first part of the first portion of the dielectric layer. The first and second line feature patterns are transferred from the first patterned hard mask layer and the patterned photoresist layer to the dielectric layer to form an interconnect-hole that extends through the first part of the first portion of the dielectric layer and a metal line trench that extends laterally in an upper portion of the dielectric layer open to the interconnect-hole.

In accordance with another exemplary embodiment, a method for fabricating an integrated circuit is provided. The method includes patterning a first hard mask layer overlying a dielectric layer of dielectric material that overlies a semiconductor substrate using a first photomask to transfer a first line feature pattern from the first photomask to the first hard mask layer to form a first patterned hard mask layer. The first line feature pattern is transferred from the first patterned hard mask layer to the dielectric layer to form a first metal line trench section that extends laterally in an upper portion of the dielectric layer. A hard mask-forming material is conformally deposited overlying the first patterned hard mask layer and the first metal line trench section to form a conformal-coated patterned hard mask layer. A second line feature pattern is transferred from a second photomask to the conformal-coated patterned hard mask layer such that the second line feature pattern partially overlaps a first part of the first metal line trench section to form a second patterned hard mask layer. The second line feature pattern is transferred from the second patterned hard mask layer to the dielectric layer to form an interconnect-hole that extends through a lower portion of the dielectric layer directly below the first part of the first metal line trench section and a second metal line trench section that extends laterally in the upper portion of the dielectric layer continuous with the first metal line trench section to form a metal line trench that is open to the interconnect-hole.

BRIEF DESCRIPTION OF THE DRAWINGS

The various embodiments will hereinafter be described in conjunction with the following drawing figures, wherein like numerals denote like elements, and wherein:

FIGS. 3-4C illustrate, in top views, methods for fabricating integrated circuits using a multi-patterning process in accordance with an exemplary embodiment.

DETAILED DESCRIPTION

The following Detailed Description is merely exemplary in nature and is not intended to limit the various embodiments or the application and uses thereof Furthermore, there is no intention to be bound by any theory presented in the preceding background or the following detailed description.

Various embodiments contemplated herein relate to methods for fabricating integrated circuits using improved multi-patterning processes. In an exemplary embodiment, a master pattern layout for a semiconductor device layer that includes a target metal line with a target interconnecting via/contact (e.g., target interconnecting via or a target interconnecting contact) is decomposed into a first sub-pattern and a second sub-pattern. The target metal line is decomposed into a first line feature pattern that is part of the first sub-pattern and a second line feature pattern that is part of the second sub-pattern such that the first and second line feature patterns have overlapping portions defining a stitch that corresponds to the target interconnecting via/contact. "Stitching" is herein understood to be a process for breaking one polygon into two overlapping polygons that can be patterned on separate single layers (e.g., separate photomasks) and the overlapping portions of the polygons is called a "stitch." A first photomask is generated that corresponds to the first sub-pattern. A second photomask is generated that corresponds to the second sub-pattern. As such, each of the first and second photomasks contain sub-pattern details for both the target metal line and the target interconnecting via/contact (e.g., defined by the overlapping portions or the stitch) and no separate sub-pattern(s) and corresponding additional photomask(s) is needed for defining just the interconnecting via/contact, thereby reducing the total number of photomasks for the multi-patterning process for reducing cost and improving efficiency relative to conventional multi-patterning techniques.

Figure 1:
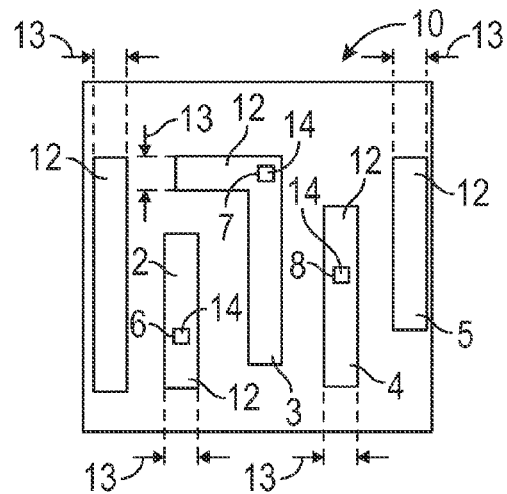
FIGS. 1-2D illustrate methods for fabricating integrated circuits using a conventional multi-patterning process.
Figure 2A:
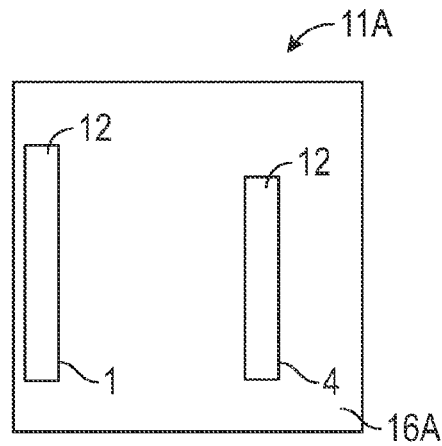
Figure 2B:
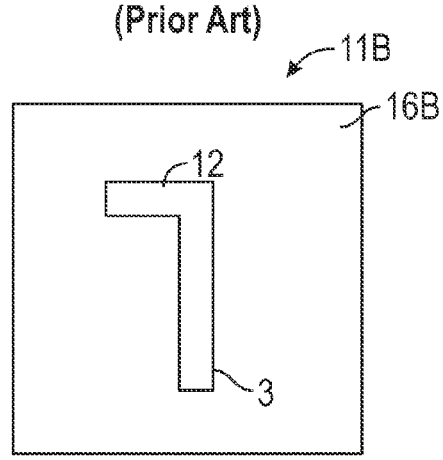
Figure 2C:
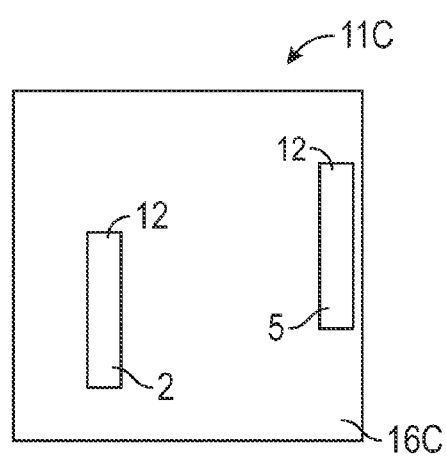
Figure 2D:
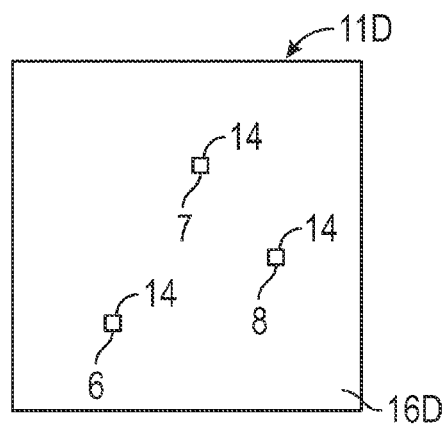

Referring to FIGS. 1-2D, an illustrative multi-patterning technique is provided together with the following brief explanation to identify some of the unique features of multi-patterning technology. As illustrated, a master pattern layout 10 (e.g., design layout created with a computer aided design (CAD) program or the like) of a semiconductor device layer (e.g., a metallization layer in a BEOL interconnect structure or a middle-end-of-line interconnect structure that includes contacts to a FEOL structure) includes five target metal lines 12 that are correspondingly numbered 1-5 and additionally includes three target interconnecting via/contacts 14 that are correspondingly numbered 6-8. The target interconnecting via/contacts 14 underlie the target metal lines and interconnect the target metal lines 2-4 of the semiconductor device layer with other target metal lines and/or devices (not shown) of a lower semiconductor device layer in an IC stack. Each of the target metal lines 12 has the same critical dimension (indicated by arrows 13). The space between the target metal lines 12 in the master pattern layout 10 is such that the master pattern layout 10 cannot be printed using a single mask with available photolithography tools. The space in the master pattern layout 10 is often called "different color space" or "different mask space." As such, the master pattern layout 10 is then decomposed into a sub-pattern 11A including the target metal lines 1 and 4, a sub-pattern 11B including the target metal line 3, a sub-pattern 11C including the target metal lines 2 and 5, and a sub-pattern 11D including the target interconnecting via/contacts 6-8. The sub-patterns 11A-11D are referred to as "sub-patterns" because each of them contains less than all of the target metal lines 12 and target interconnecting via/contacts 14 in the master pattern layout 10.

The target metal lines 12 and target interconnecting via/contacts 14 that are incorporated in the sub-patterns 11A-11D are selected and spaced such that the sub-patterns 11A-11D may be readily formed in a masking layer(s) using available photolithography tools. The space between the target metal lines 12 and the target interconnecting via/contacts 14 in the sub-patterns is often called "same color space" or "same mask space." Ultimately, when the mask design process is completed, data corresponding to the sub-patterns 11A-11D (modified as necessary during the design process) will be provided to a mask manufacture that will produce tangible photomasks 16A-16D corresponding to sub-patterns 11A-11D to be used in a photolithography tool to manufacture integrated circuit products. Notably, the master pattern layout 10 in this illustrative example is decomposed into four sub-patterns 11A-11D for generating four corresponding photomasks 16A-16D including, in particular, the three photomasks 16A-C with the sub-patterns 11A-C consisting exclusively of one or more of the target metal lines 12 and the additional photomask 16D with the sub-pattern 11D that consist exclusively of the target interconnecting via/contacts 14. In this example, the multi-patterning process is referred to as a triple-patterning process because, in general, the type of multi-patterning process is defined by the number of sub-patterns (e.g., sub-patterns 11A-11C) that contain details corresponding to the target metal lines 12 in a particular semiconductor layer without considering the target interconnecting via/contacts 14 that extend from the particular semiconductor layer to an underlying semiconductor layer and/or device(s). This is because current multi-patterning approaches consider only the target metal lines when determining how to decompose the master pattern layout 10 and an additional sub-pattern(s) is generated specifically for the target interconnecting via/contacts 14. Accordingly, the illustrative triple-patterning process generates four photomasks that result from the decomposition of the master pattern layout 10.

FIGS. 3-21 illustrate methods for fabricating an integrated circuit (IC) 20 in accordance with various embodiments. The described process steps, procedures, and materials are to be considered only as exemplary embodiments designed to illustrate to one of ordinary skill in the art methods for practicing novel methods for fabricating an integrated circuit using a multi-patterning process as described herein; the methods as described herein are not limited to these exemplary embodiments. Various steps in the manufacture of ICs are well-known and so, in the interest of brevity, many conventional steps will only be mentioned briefly herein or will be omitted entirely without providing the well-known process details.

FIG. 3 illustrates, in plan view, a master pattern layout 22 for a semiconductor device layer 24 (see also FIG. 15) at an early design phase for the fabrication of the IC 20 (see FIGS. 5-21) in accordance with an exemplary embodiment. The master pattern layout 22 includes target metal lines 26 (correspondingly numbered 27A-27E) and target interconnecting via/contacts 28 (correspondingly numbered 29A-29C). As illustrated, the master pattern layout 22 is similarly configured to the master pattern layout 10 as shown in FIG. 1.

Referring also to FIGS. 4A-4C, the master pattern layout 22 is decomposed into sub-patterns 130, 132, and 135 using an exemplary multi-patterning process that considers not only the target metal lines 26 but also the target interconnecting via/contacts 28 for decomposing the layout 22. In particular, as illustrated in FIG. 3, the target metal line 27B is interconnected with the target interconnecting via/contact 29A, the target metal line 27C is interconnected with the target interconnecting via/contact 29B, and the target metal line 27D is interconnected with the target interconnecting via/contact 29C. In an exemplary embodiment, as illustrated in FIGS. 4A-4C, using the exemplary multi-patterning process, the target metal line 27B is decomposed into line feature patterns 30 and 31, the target metal line 27C is decomposed into line feature patterns 32 and 33, and the target metal line 27D is decomposed into line feature patterns 34 and 35. The line feature patterns 30 and 31 have non-overlapping portions 36 and 37 and overlapping portions 38 and 39 (indicated by dashed lines). Likewise, the line feature patterns 32 and 33 have non-overlapping portions 40 and 41 and overlapping portions 42 and 43 (indicated by dashed lines) and the line feature patterns 34 and 35 have non-overlapping portions 44 and 45 and overlapping portions 46 and 47 (indicated by dashed lines).

As illustrated, the sub-pattern 130 includes the target metal lines 27A and 27E and the line feature pattern 32, the sub-pattern 132 includes the line feature patterns 30, 33, and 34, and the sub-pattern 135 includes the line feature patterns 31 and 35. In this embodiment, the multi-patterning process is a triple-patterning process because all three sub-patterns 130, 132, and 134 (e.g., 3 sub-patterns) each contain details corresponding to the target metal lines 27A-27E in which the line feature patterns 30 and 31 in sub-patterns 132 and 135 define the target metal line 27B, the line feature patterns 32 and 33 in sub-patterns 130 and 132 define the target metal line 27C, and the line feature patterns 34 and 35 in sub-patterns 132 and 135 define the target metal line 27D. It is however understood that the exemplary multi-patterning process may be a double-patterning process or may be a higher order multi-patterning process than a triple-patterning process. In an exemplary embodiment, the multi-patterning process is an n+2 order multi-patterning process that decomposes the master pattern layout 22 into a total of n+2 sub-patterns in which n is an integer of greater than or equal to 1.

In an exemplary embodiment, the overlapping portions 38 and 39 of the line feature patterns 30 and 31 define a stitch 48 (as shown in FIG. 3) that is located directly overlying the target interconnecting via/contact 29A, the overlapping portions 42 and 43 of the line feature patterns 32 and 33 define a stitch 50 that is located directly overlying the target interconnecting via/contact 29B, and the overlapping portions 46 and 47 of the line feature patterns 34 and 35 define a stitch 52 that is located directly overlying the target interconnecting via/contact 29C. As will be discussed in further detail below, the stitches 48, 50, and 52 (e.g., overlapping portions 38-39, 42-43, and 46-47) provide details that can be used later during downstream multi-patterning processing to produce interconnecting via/contacts that correspond to the target interconnecting via/contacts 29A-C. As such, in an exemplary embodiment, the sub-patterns 130, 132, and 134 additionally contain details corresponding to the target interconnecting via/contacts 29A-C without needing any additional separate sub-patterns (e.g., sub-patterns that consist of one or more of the target interconnecting via/contacts 28) to define the target interconnecting via/contacts 29A-C.

Photomasks 54, 56, and 58 are generated that corresponds to sub-patterns 130, 132, and 134, respectively. In an exemplary embodiment, using an appropriate software program executed by a computer processor, a set of mask data is generated corresponding to each of the sub-patterns 130, 132, and 134. The sets of mask data may be provided, for example, to a mask writer and/or a mask manufacture to generate the photomasks 54, 56, and 58. Other methods for generating a photomask known to those skilled in the art using mask data may also be used. Notably, in this embodiment, the target interconnecting via/contacts 28 are considered in accordance with implementing the multi-patterning process when determining how to decompose the master pattern layout 22, which results in generating three photomasks for providing lithographical details for defining the target metal lines 26 and the target interconnecting via/contacts 28, thereby reducing the total number of photomasks compared to the illustrative multi-patterning process described above in reference to FIGS. 1-2D. In an exemplary embodiment, in accordance with implementing the multi-patterning process, the total number of photomasks generated matches the order of the multi-patterning process and each of the photomasks includes one or more of the target metal lines 27A, 27B, 27C, 27D, and/or 27E and/or one or more of the line feature patterns 30, 31, 32, 33, 34, and/or 34.

FIGS. 5-21, illustrate, in cross-sectional views, a portion of the IC 20 that is correspondingly represented in the master pattern layout 22 along line 5-5, and further includes underlying layers and features that are not shown in the master pattern layout 22, in accordance with various exemplary embodiments. In particular, FIGS. 5-21 illustrate various fabrication stages for forming a metal line 60 and an interconnecting via/contact 62 (see FIGS. 14 and 15) in the IC 20 that correspond to the target metal line 27D and the interconnecting via/contact 29C (see FIG. 1), respectively, using the exemplary multi-patterning process. Although the exemplary multi-patterning process as described in further detail below refers only to pattern transferring the target metal line 27D and the interconnecting via/contact 29C from the master pattern layout 22 to the IC 20 using photomasks 56 and 58 to form the metal line 60 and the interconnecting via/contact 62, it is to be understood that in practice all of the photomasks 54, 56, and 58 may be used to transfer all of the target metal lines 26 and the target interconnecting via/contacts 28 from the master pattern layout 22 to the IC 20 to form a plurality of metal lines and interconnecting via/contacts using the various fabrication steps or substantially similar fabrication steps as described herein.

Figure 5:
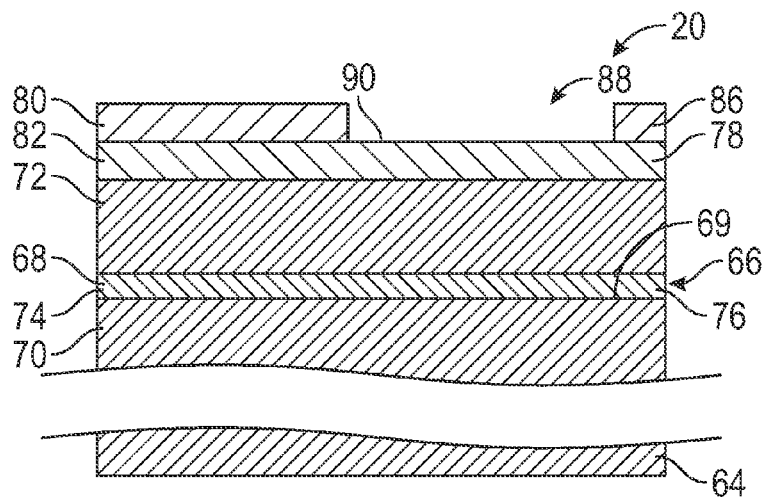
FIGS. 5-21 illustrate, in cross-sectional views, an integrated circuit during various fabrication stages and methods for fabricating integrated circuits in accordance with various exemplary embodiments.

Referring to FIG. 5, the portion of the IC 20 is illustrated during an intermediate fabrication stage in accordance with an exemplary embodiment. The IC 20 includes a semiconductor substrate 64 that may represent any appropriate carrier material, such as silicon or silicon-based materials, and the like. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

Additionally, the semiconductor substrate 64 may include active areas (not shown) in which a plurality of active and/or passive semiconductor devices (not shown), such as transistors, capacitors, resistors, and the like may be formed therein and/or thereon. It should be appreciated that the semiconductor substrate 64, even if including a substantially silicon-based material layer, may include other semiconducting materials in addition to appropriate dopant species for establishing the requisite active area conductivity type for the circuit elements.

In embodiments and as illustrated in FIG. 5, the IC 20 includes a conductive interconnect structure 66 that overlies (e.g., "over" or "on") the semiconductor substrate 64 and that includes a metal line 68. The metal line 68 is disposed between dielectric layers 70 and 72 of dielectric material. The dielectric layers 70 and 72 may be formed of a suitable dielectric material, such as silicon dioxide ($SiO_2$), carbon-doped oxide, organosilicate glass, or the like. In an exemplary embodiment, the dielectric layers 70 and 72 are formed of a dielectric material that includes silicon and oxygen, such as $SiO_2$ or SiCOH. The dielectric layers 70 and 72 may be relatively thick, each having a thickness of, for example, from about 200 to about 1500 nm.

Electrical connection(s) between the conductive interconnect structure 66 and the electrical devices (not shown) that may be disposed on and/or in the semiconductor substrate 64 can be established with one or more conductive vias/contacts (not shown) in the dielectric layer 70. It is to be appreciated that, depending on the overall device requirements, the IC 20 may include many conductive interconnect structures 66 that may be disposed, for example, in one or more layers in which each layer defines a metallization layer 74 (e.g., also referred to herein as a semiconductor device layer) as is well-known in the art. The metallization layers 74 may be connected together to form a back-end-of-the-line ("BEOL") interconnect structure. Additionally or alternatively, one or more of the metallization layer 74 may be connected to an electrical device(s) on and/or in the semiconductor substrate 64 to form an interconnection with a front-and-of-the-line ("FEOL") structure.

The exemplary metal line 68 is formed of a conductive metal fill 76 optionally with a conductive seed layer (not shown) and a liner 69 in accordance with conventional techniques. An exemplary conductive metal fill 76 is an electrically conductive material such as copper. An exemplary liner 69 includes one or more layers of a liner-forming material(s) such as tantalum (Ta), tantalum nitride (TaN), ruthenium (Ru), and/or the like to help inhibit or prevent diffusion of the conductive metal fill 76 into the dielectric layers 70 and 72 and/or to facilitate adhesion of the conductive metal fill 76 to the dielectric layers 70 and 72. In an exemplary embodiment, the liner 69 is formed of multiple layers including a barrier layer of Ta with one or more overlying liner layers of TaN. In an exemplary embodiment, the liner 69 has a thickness of from about 0.5 to about 10 nm.

Overlying the dielectric layer 72 is a hard mask layer 78 and a patterned photoresist layer 86 that is disposed overlying the hard mask layer 78. The hard mask layer 78 is formed of a hard mask-forming material such as silicon dioxide, silicon nitride, or the like. In an exemplary embodiment, the hard mask layer 78 has a thickness of from about 5 to about 20 nm, such as from about 10 to about 15 nm.

The illustrated portion of the IC 20 may be formed on the basis of conventional techniques. In an exemplary embodiment, the dielectric layer 70 is formed by depositing a dielectric material such as $SiO_2$ or SiCOH that includes organic porogen overlying the semiconductor substrate 64. The dielectric material may be deposited using a chemical vapor deposition (CVD) process and the dielectric material may be treated, for example with UV radiation, to out gas the porogen and form porosity in the dielectric layer 70 to further lower the dielectric constant of the dielectric material. Next, the exemplary dielectric layer 70 is patterned and etched using, for example, a dry etching process to form a metal line trench(es) as well as an interconnect-hole(s) (not shown). The metal line trench(es) and interconnect-hole(s) are then filled by depositing the liner-forming material(s) and the conductive metal fill 76 into the trench(es) and hole(s), such as by using a physical vapor deposition (PVD) process (or an atomic layer deposition (ALD) process) and an electrochemical plating (ECP) process, respectively, to form the liner layer 69 and the metal line 68, respectively. Any overburden of the conductive metal fill 76 and/or the liner-forming material(s) is removed by chemical mechanical planarization (CMP) to expose upper surfaces of the dielectric layer 70 and the metal line 68. Next, the dielectric layer 72 is formed as described above in relation to the dielectric layer 70. The hard mask-forming material 82 is deposited overlying the dielectric layer 72 and the metal line 68 and is planarized. The hard mask-forming material may be deposited, for example, by the decomposition of a source material such as tetraethylorthosilicate (TEOS) and is planarized, for example, by a CMP process. The photoresist layer 80 is formed by depositing a photoresist-forming material 84, which are well-known in the art and readily available commercially, using, for example, a spin coating process.

Referring to FIGS. 3, 4B, and 5, the multi-patterning process continues by patterning the photoresist layer 80 using the photomask 56 and the multi-patterning process to transfer the sub-pattern 132 including the line feature pattern 34 from the photomask 56 to the photoresist layer 80 to form a patterned photoresist layer 86. In an exemplary embodiment, the patterned photoresist layer 86 is formed by positioning the photomask 56 in a conventional photolithography tool that may be any desired configuration and employ any desire wavelength or form of radiation to transfer the sub-pattern 132 from the photomask 56 to the photoresist layer 80 in which the light or radiation causes a chemical change in the photoresist layer 80 such that either the exposed portion(s) or the non-exposed portion(s) of the photoresist layer 80 can be selectively removed (depending upon the type of photoresist used), for example, using an organic solvent to selectively remove portions of the photoresist and thereby form the patterned photoresist layer 86. As illustrated, the patterned photoresist layer 86 has a line feature pattern opening 88 formed therethrough that corresponds to the line feature pattern 34 and that exposes a portion 90 of the underlying hard mask layer 78.

Figure 6:
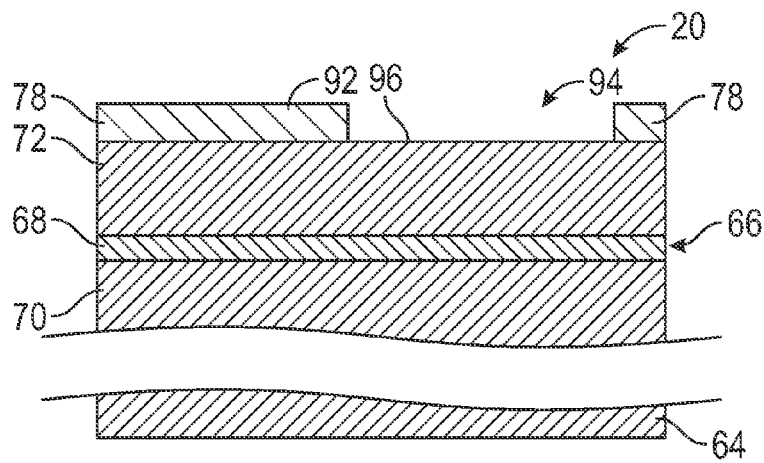
Figure 7:
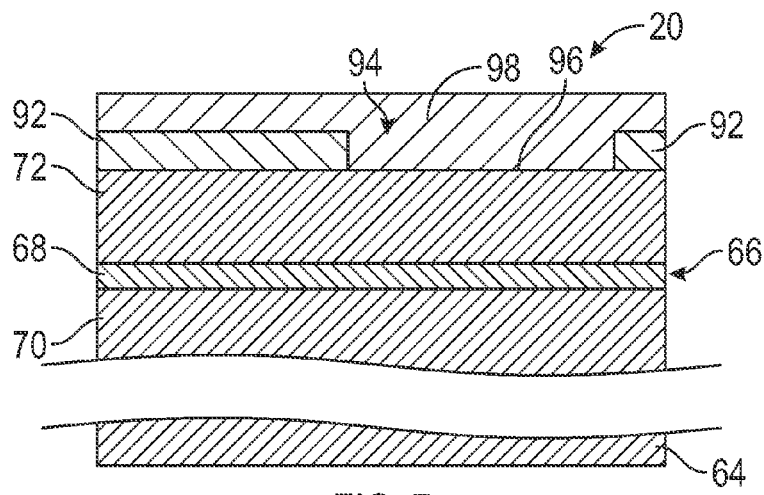
Figure 8:
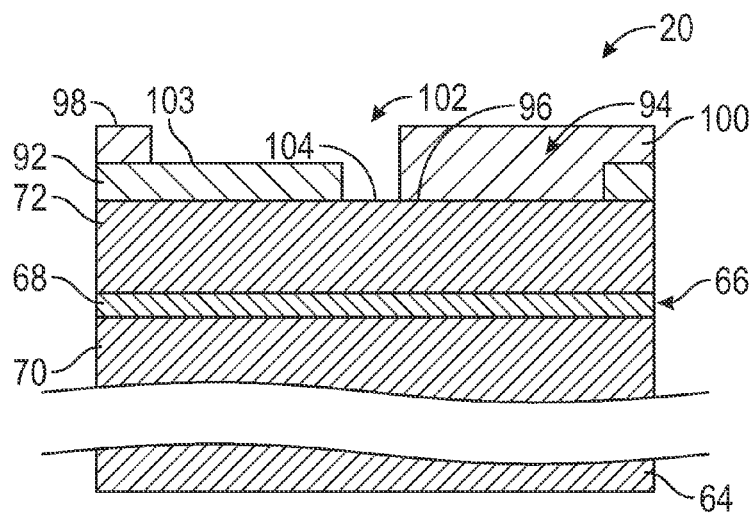

Referring to FIGS. 4B and 5-6, next the sub-pattern 132 including the line feature pattern 34 is transferred from the patterned photoresist layer 86 to the hard mask layer 78 to form a patterned hard mask layer 92. In an exemplary embodiment, the patterned hard mask layer 92 is formed by using the patterned photoresist layer 86 as an etch mask and exposing the portion 90 of the hard mask layer 78 to an etching process to transfer the sub-pattern 132 to the hard mask layer 78, thereby forming a line feature pattern opening 94 through the hard mask layer 78. Depending upon the type of hard mask material employed, conventional etching process may be employed. For example, a suitable hard mask etching process may be a dry etching process, such as a reactive ion etching (RIE) process, or alternatively, a wet etching process that uses, for example, a relatively weak acid or acidic solution. The patterned photoresist layer 86 is then removed, for example, using an oxygen containing plasma. As illustrated in FIG. 6, the line feature pattern opening 94 in the patterned hard mask layer 92 corresponds to the line feature pattern 34 from the sub-pattern 132 (see FIG. 4B) and exposes a portion 96 of the underlying dielectric layer 72.

Referring to FIGS. 4B-4C and 7-8, the process continues by forming a photoresist layer 98 overlying the patterned hard mask layer 92 and the portion 96 of the dielectric layer 72, for example, using a spin coating process. The photoresist layer 98 is then patterned using the photomask 58 and the multi-patterning process to transfer the sub-pattern 135 including the line feature pattern 35 from the photomask 58 to the photoresist layer 98 to form a patterned photoresist layer 100. In an exemplary embodiment, the patterned photoresist layer 100 is formed by positioning the photomask 58 in the photolithography tool as discussed above to transfer the sub-pattern 135 to the photoresist layer 98 in which the exposed portion(s) or the non-exposed portion(s) of the photoresist layer 98 can be selectively removed, for example, using an organic solvent to form the patterned photoresist layer 100. As illustrated, the patterned photoresist layer 100 has a line feature pattern opening 102 formed therethrough that corresponds to the line feature pattern 35 from the sub-pattern 135 and that exposes a portion 103 of the underlying patterned hard mask layer 92 and a part 104 of the portion 96 of the dielectric layer 72. In particular, the line feature pattern openings 94 and 102 partially overlap to expose the part 104 of the dielectric layer 72. The overlapping of the line feature pattern openings 94 and 102 correspond to the overlapping portions 46 and 47 of the line feature patterns 34 and 35 from the sub-patterns 132 and 135, which corresponds to the stitch 52 for the target interconnecting via/contact 29C from the master pattern layout 22 (see FIG. 3).

Figure 9:
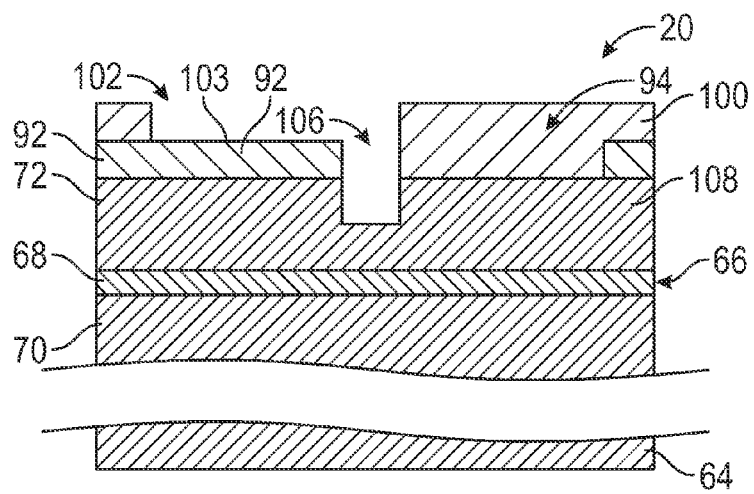

Referring also to FIG. 9, in an exemplary embodiment, the multi-patterning process continues by using the patterned hard mask layer 92 and the patterned photoresist layer 100 as etch masks, exposing the part 104 of the dielectric layer 72 to an etching process (e.g., anisotropic etching process) to form a recess 106 that extends through the part 104 in an upper portion 108 of the dielectric layer 72. The dielectric layer 72 may be selectively etched to form the recess 106 using, for example, a RIE process with sulfur hexafluoride. In an exemplary embodiment, the recess 106 corresponds to the stitch 52 for the target interconnecting via/contact 29C from the master pattern layout 22 (see FIG. 3).

Figure 10:
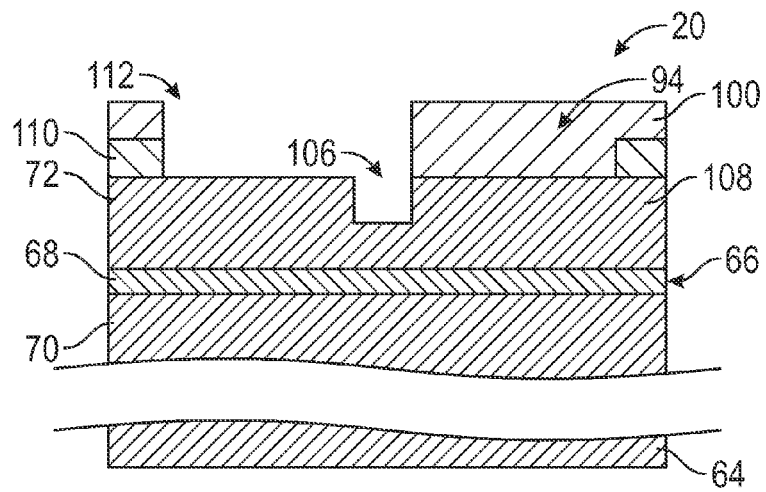

The process continues by transferring the sub-pattern 135 including the line feature pattern 35 (see FIG. 4C), which is defined by the line feature pattern opening 102 in the patterned photoresist layer 100, to the patterned hard mask layer 92 to form a patterned hard mask layer 110 as shown in FIG. 10. In an exemplary embodiment, the patterned hard mask layer 110 is formed by using the patterned photoresist layer 100 as an etch mask and exposing the portion 103 of the patterned hard mask layer 92 to an etching process to transfer the sub-pattern 135 to the patterned hard mask layer 92, thereby forming a line feature pattern opening 112 through the patterned hard mask layer 92. The etching process may be a dry etching process, such as a RIE process, or alternatively, a wet etching process that uses, for example, a relatively weak acid or acidic solution. In an exemplary embodiment, the etching process is timed or the end point of the etch is otherwise detected once the patterned hard mask layer 92 is fully opened.

Figure 11:
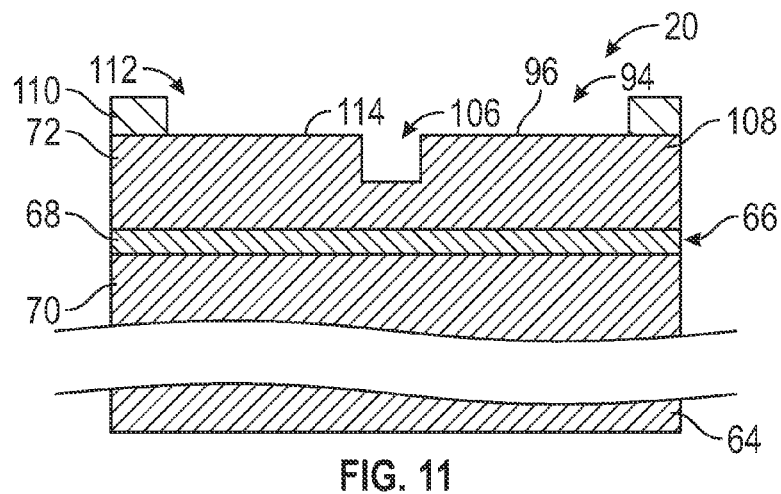
Figure 12:
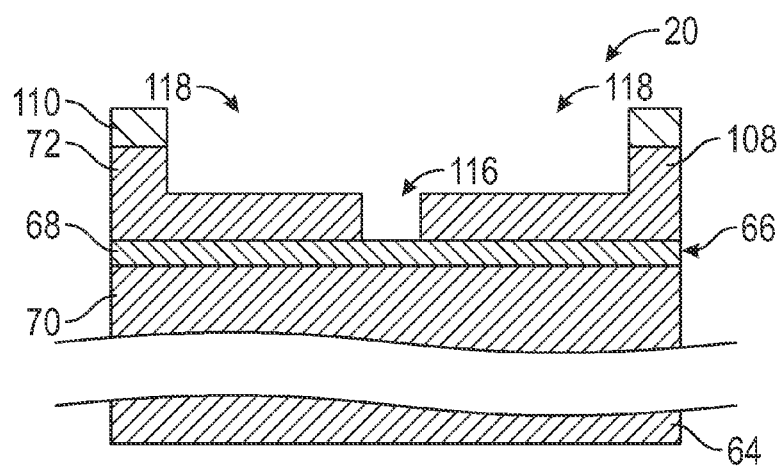

The patterned photoresist layer 100 is then removed to form the IC 20 as illustrated in FIG. 11, for example, using an oxygen containing plasma. In an exemplary embodiment and as illustrated in FIG. 11, the line feature pattern openings 94 and 112, which corresponds to the line feature patterns 34 and 35 (see FIGS. 4B-4C), are continuous and formed through the patterned hard mask layer 110 to expose the recess 106 and the portions 96 and 114 of the dielectric layer 72.

Referring to FIGS. 4B-4C and 11-13, the line feature patterns 34 and 35 are transferred to the dielectric layer 72 by using the patterned hard mask layer 110 as an etch mask and exposing the recess 106 and the portions 96 and 114 to an etching process to form an interconnect-hole 116 and a metal line trench 118. The interconnect-hole 116 extends the recess 106 lower in the dielectric layer 72 and the metal line trench 118 extends laterally in the upper portion 108 of the dielectric layer 72 and is open to the interconnect-hole 116.

Figure 13:
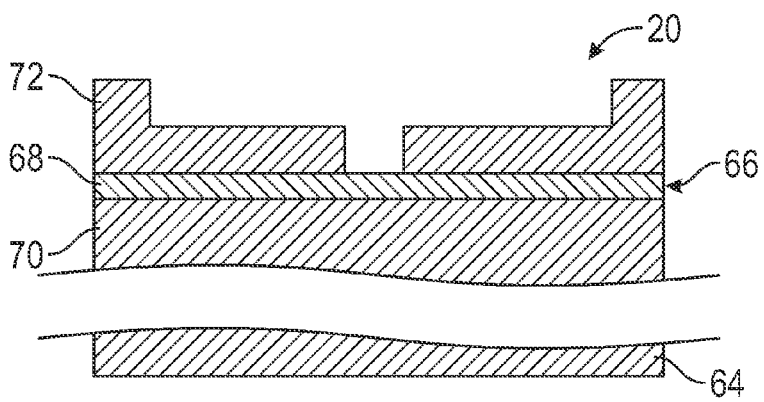

As illustrated, the interconnect-hole 116 extends through the dielectric layer 72 to expose the metal line 68. The metal line trench 118 and the interconnect-hole 116 may be formed using well-known etching techniques (e.g., dry etching techniques such as plasma etching or the like). The patterned hard mask layer 110 may optionally be removed (e.g., via a CMP process) to form the IC 20 as illustrated in FIG. 13, or alternatively, may remain intact for removal during further downstream processing.

Figure 14:
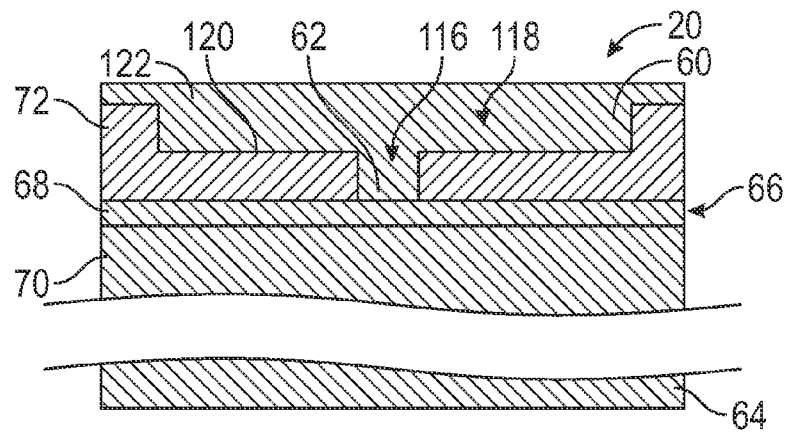
Figure 15:
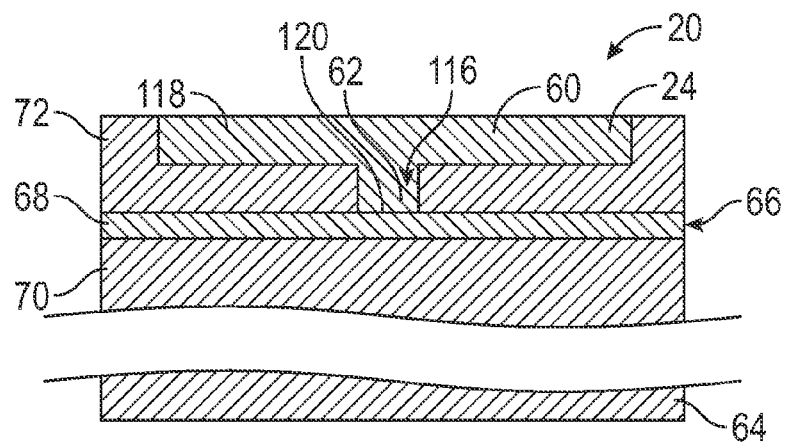

In an embodiment and referring to FIGS. 14 and 15, a liner-forming material(s) is then deposited into the metal line trench 118 and the interconnect-hole 116 to form a liner 120. In an exemplary embodiment, the liner-forming material(s) includes Ta, TaN, Ru, and/or like and is deposited using a PVD process, a CVD process, an ALD process, and/or the like.

The process continues by depositing a conductive metal fill 122 (e.g., copper or copper alloy) into the metal line trench 118 and the interconnect-hole 116 overlying the liner 120 to form the metal line 60 and the interconnecting via/contact 62 that forms an interconnect between the metal lines 60 and 68. As is well-known in the art, a copper seed layer may be deposited overlying the liner 120 prior to depositing the conductive metal fill 122 using, for example, a PVD process. In an exemplary embodiment, the conductive metal fill 122 is deposited overlying the liner 120 using an ECP process. Any overburden of the conductive metal fill 122 may be removed by planarizing the dielectric layer 72, the liner 120, and the conductive metal fill 122 using a CMP process to form the IC 20 as illustrated in FIG. 15. Although feature 68 is illustrated as a metal line, it is to be understood that feature 68 can alternatively represent an underlying device or a portion of an underlying device or feature that is arranged above, on, and/or in the semiconductor substrate 64 and, as such, the interconnecting via/contact 62 can be a conductive via or a conductive contact to the feature 68, which can be a gate, a metal silicide region (e.g., trench metal silicide) that connects to a well or active region, or any other underlying feature.

Figure 16:
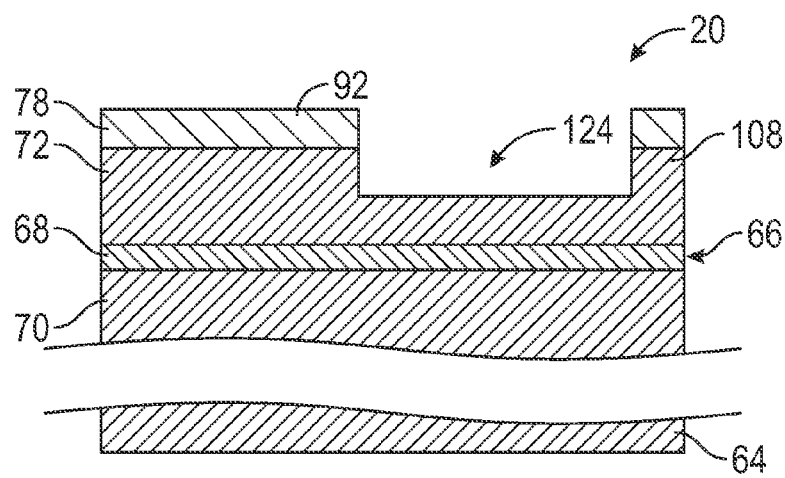

In an alternative exemplary embodiment and with reference to FIGS. 4B, 6 and 16, after forming the patterned hard mask layer 92 (FIG. 6), the line feature pattern 34 (FIG. 4B) that is defined in the patterned hard mask layer 92 by the line feature pattern opening 94 is transferred from the patterned hard mask layer 92 to the dielectric layer 72 to form a metal line trench section 124 (FIG. 16) that extends laterally in the upper portion 108 of the dielectric layer 72. In one embodiment, the line feature pattern 34 is transferred to the dielectric layer 72 by using the patterned hard mask layer 92 as an etch mask and exposing the portion 96 of the dielectric layer 72 to an etching process (dry etching technique such as plasma etching or the like) to form the metal line trench section 124.

Figure 17:
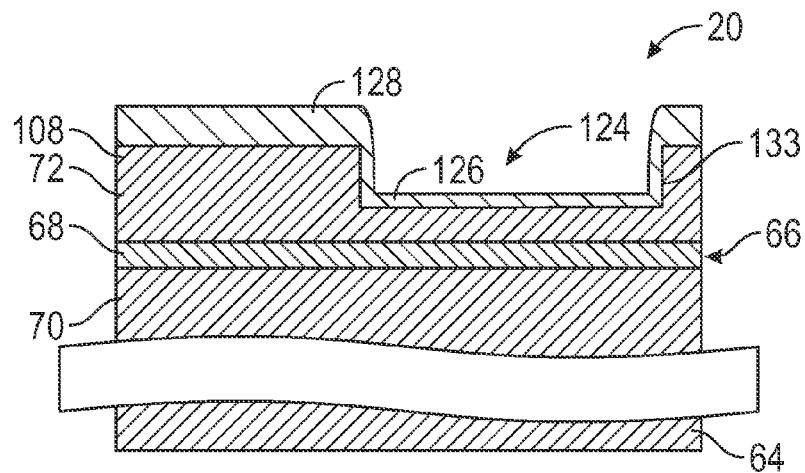
Figure 18:
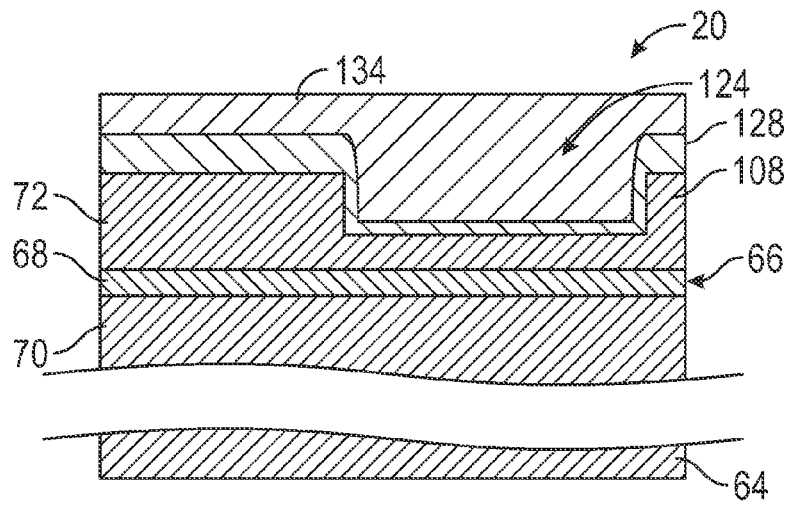
Figure 19:
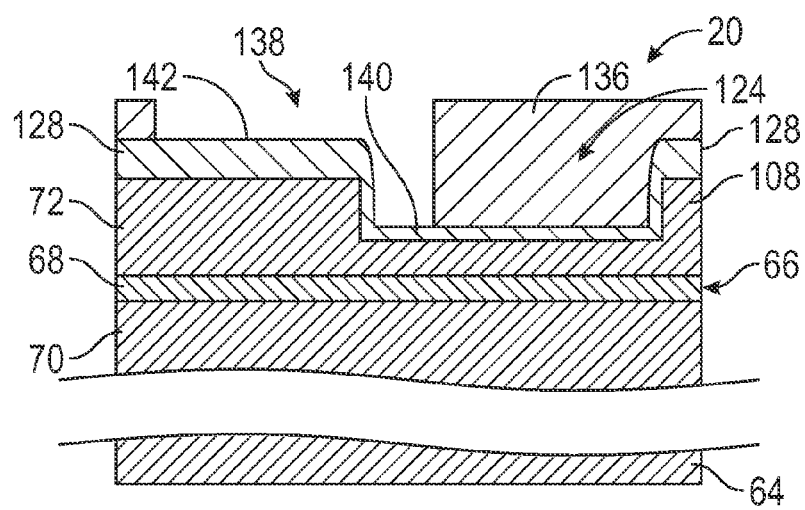

The process continues by conformally depositing a hard mask-forming material 126 (e.g., silicon dioxide, silicon nitride, or the like) overlying the patterned hard mask layer 92 and the metal line trench section 124 to form a conformal-coated patterned hard mask layer 128 as illustrated in FIG. 17. Referring also to FIG. 17, the hard mask-forming material 126 is conformally deposited along the sidewalls 131 and 133 of the upper portion 108 of the dielectric layer 72 that defines the metal line trench section 124. The hard mask-forming material 126 may be conformally deposited, for example, by the decomposition of a source material such as tetraethylorthosilicate (TEOS) to form silicon dioxide, or alternatively, by reacting ammonia and dichlorosilane in a low pressure CVD deposition furnace to form a silicon nitride, or alternatively, by depositing the hard mask-forming material 126 using an atomic layer deposition (ALD) process to form a conformal isotropic coating of the hard mask-forming material 126.

Referring to FIGS. 4B-4C and 18-19, a photoresist layer 134 is formed overlying the conformal-coated patterned hard mask layer 128, for example, using a spin coating process. The photoresist layer 134 is then patterned using the photomask 58 to transfer the sub-pattern 135 including the line feature pattern 35 from the photomask 58 to the photoresist layer 134 to form a patterned photoresist layer 136. As discussed above, in an exemplary embodiment, the patterned photoresist layer 136 is formed by positioning the photomask 58 in the photolithography tool to transfer the sub-pattern 135 to the photoresist layer 134 in which the exposed portion(s) or the non-exposed portion(s) of the photoresist layer 134 can be selectively removed, for example, using an organic solvent to form the patterned photoresist layer 136. As illustrated, the patterned photoresist layer 136 has a line feature pattern opening 138 formed therethrough defining the line feature pattern 35 that overlaps a part 140 of the metal line trench section 124 and that exposes a portion 142 of the underlying conformal-coated patterned hard mask layer 128. In particular, the overlapping portion of the line feature pattern opening 138 with the part 140 of the metal line trench section 124 correspond to the overlapping portions 46 and 47 of the line feature patterns 34 and 35 from the sub-patterns 132 and 135, which corresponds to the stitch 52 that overlies the target interconnecting via/contact 29C from the master pattern layout 22 (shown in FIG. 3).

Figure 20:
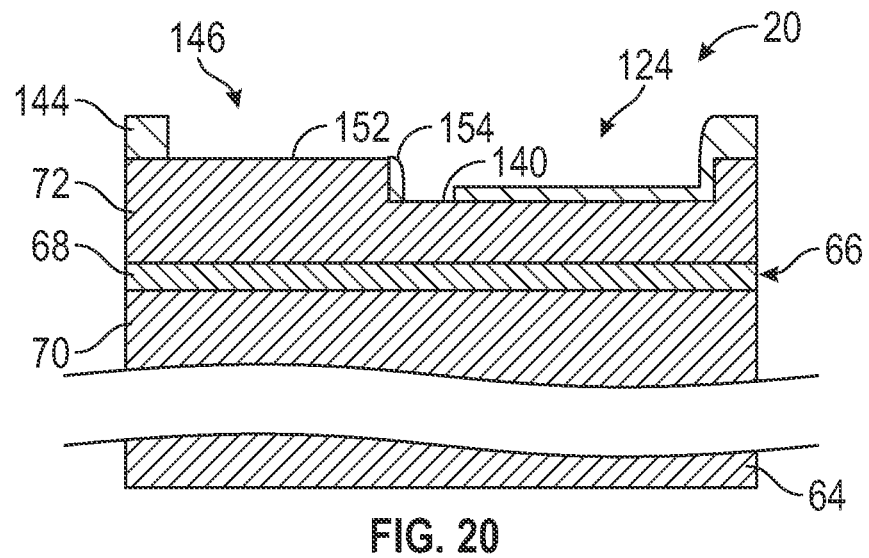
Figure 21:
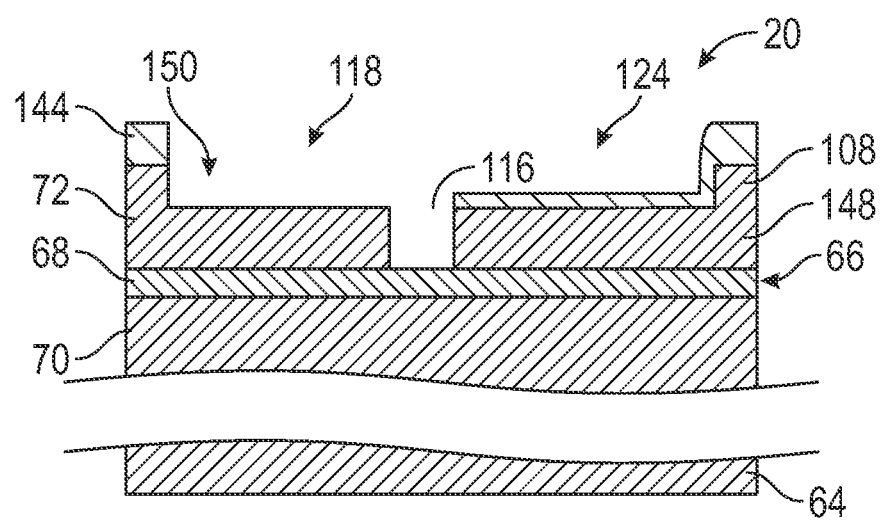

The process continues by transferring the sub-pattern 135 including the line feature pattern 35 (see FIG. 4C), which is defined by the line feature pattern opening 138 in the patterned photoresist layer 136, to the conformal-coated patterned hard mask layer 128 to form a patterned hard mask layer 144 as shown in FIG. 20. In an exemplary embodiment, the patterned hard mask layer 144 is formed by using the patterned photoresist layer 136 as an etch mask and exposing the portion 142 of the conformal-coated patterned hard mask layer 128 to an etching process to transfer the sub-pattern 135 including forming a line feature pattern opening 146 through the conformal-coated patterned hard mask layer 128. The etching process may be a dry etching process, such as a RIE process, or alternatively, a wet etching process that uses, for example, a relatively weak acid or acidic solution.

Referring to FIGS. 4B-4C and 20-21, the process continues by transferring the sub-pattern 135 including the line feature pattern 35 (see FIG. 4C), which is defined by the line feature pattern opening 146 in the patterned hard mask layer 144, to the dielectric layer 72 to form the interconnect-hole 116 (as discussed above) that extends through a lower portion 148 of the dielectric layer 72 directly below the part 140 of the metal line trench section 124 and a metal line trench section 150 that extends laterally in the upper portion 108 of the dielectric layer 72. As illustrated, the metal line trench section 150 is continuous with the metal line trench section 124 and together the trench sections 124 and 150 form the metal line trench 118 (as discussed above). The metal line trench section 150 and the interconnect-hole 116 may be formed by using the patterned hard mask layer 144 as an etch mask and exposing a portion 152 of the dielectric layer 72 including directly below the part 140 of the metal line trench section 124 to an etching process. The metal line trench section 150 and the interconnect-hole 116 may be formed using well-known etching techniques (e.g., dry etching techniques such as plasma etching or the like). The patterned hard mask layer 144 including a sidewall portion 154 may be removed, for example by erosion from the dry etching or plasma etching process, to form the IC 20 as illustrated in FIG. 13. The process then continues as discussed in relation to FIGS. 14-15 to form the IC 20 as illustrated in FIG. 15.

Accordingly, methods for fabricating integrated circuits using multi-patterning processes have been described. In an exemplary embodiment, a master pattern layout for a semiconductor device layer that includes a target metal line with a target interconnecting via/contact is decomposed into a first sub-pattern and a second sub-pattern. The target metal line is decomposed into a first line feature pattern that is part of the first sub-pattern and a second line feature pattern that is part of the second sub-pattern such that the first and second line feature patterns have overlapping portions corresponding to the target interconnecting via/contact. A first photomask is generated that corresponds to the first sub-pattern. A second photomask is generated that corresponds to the second sub-pattern.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
   patterning a first hard mask layer overlying a dielectric layer of dielectric material that overlies a semiconductor substrate using a first photomask to transfer a first line feature pattern from the first photomask to the first hard mask layer to form a first patterned hard mask layer having a first line feature opening formed therethrough that corresponds to the first line feature pattern and that exposes a first portion of the dielectric layer;
   depositing a photoresist layer overlying the first patterned hard mask layer including overlying the first portion of the dielectric layer;
   patterning the photoresist layer using a second photomask to transfer a second line feature pattern from the second photomask to the photoresist layer to form a patterned photoresist layer having a second line feature opening formed therethrough that corresponds to the second line feature pattern, wherein patterning the photoresist layer comprises forming the patterned photoresist layer such that the first and second line feature openings partially overlap to expose a first part of the first portion of the dielectric layer; and
   transferring the first and second line feature patterns from the first patterned hard mask layer and the patterned photoresist layer to the dielectric layer to form an interconnect-hole that extends through the first part of the first portion of the dielectric layer and a metal line trench that extends laterally in an upper portion of the dielectric layer open to the interconnect-hole, wherein the interconnect-hole extends through a lower portion of the dielectric layer directly below the first part of the metal line trench.

2. The method of claim 1, wherein transferring the first and second line feature patterns comprises exposing the first part of the first portion of the dielectric layer to a first etching process using the patterned photoresist layer and the first patterned hard mask layer as first etch masks to form a recess through the first part of the dielectric layer.

3. The method of claim 2, wherein transferring the first and second line feature patterns comprises transferring a non-overlapping portion of the second line feature pattern to the first patterned hard mask layer using a second etching process and the patterned photoresist layer as a second etch mask to form a second patterned hard mask layer having a second line feature opening formed therethrough that corresponds to the non-overlapping portion of the second line feature pattern and that exposes a second portion of the dielectric layer adjacent to the recess on a side opposite a remaining part of the first portion of the dielectric layer.

4. The method of claim 3, wherein transferring the first and second line feature patterns comprises removing the patterned photoresist layer to expose the remaining part of the first portion of the dielectric layer.

5. The method of claim 4, wherein transferring the first and second line feature patterns comprises exposing the second portion of the dielectric layer, the recess, and the remaining part of the first portion of the dielectric layer to a third etching process using the second patterned hard mask layer as a third etch mask to form the interconnect-hole and the metal line trench.

6. A method for fabricating an integrated circuit, the method comprising:
   patterning a first hard mask layer overlying a dielectric layer of dielectric material that overlies a semiconductor substrate using a first photomask to transfer a first line feature pattern from the first photomask to the first hard mask layer to form a first patterned hard mask layer;
   transferring the first line feature pattern from the first patterned hard mask layer to the dielectric layer to form a first metal line trench section extending laterally in an upper portion of the dielectric layer;
   conformally depositing a hard mask-forming material overlying the first patterned hard mask layer and the first metal line trench section to form a conformal-coated patterned hard mask layer;
   transferring a second line feature pattern from a second photomask to the conformal-coated patterned hard mask layer such that the second line feature pattern partially overlaps a first part of the first metal line trench section to form a second patterned hard mask layer; and
   transferring the second line feature pattern from the second patterned hard mask layer to the dielectric layer to form an interconnect-hole that extends through a lower portion of the dielectric layer directly below the first part of the first metal line trench section and a second metal line trench section that extends laterally in the upper portion of the dielectric layer continuous with the first metal line trench section to form a metal line trench that is open to the interconnect-hole.

7. The method of claim 6, wherein conformally depositing the hard mask-forming material comprises conformally depositing the hard mask-forming material along a sidewall of the upper portion of the dielectric layer proximate the first part of the first metal line trench section.

8. The method of claim 7, wherein transferring the second line feature pattern to the conformal-coated patterned hard mask layer comprises depositing a photoresist layer overlying the conformal-coated patterned hard mask layer including overlying a sidewall portion of the hard mask-forming material that is disposed along the sidewall of the upper portion of the dielectric layer.

9. The method of claim 8, wherein transferring the second line feature pattern to the conformal-coated patterned hard mask layer comprises patterning the photoresist layer using the second photomask to transfer the second line feature pattern to the photoresist layer to form a patterned photoresist layer.

10. The method of claim 9, wherein transferring the second line feature pattern to the conformal-coated patterned hard mask layer comprises etching the conformal-coated patterned hard mask layer using a first etching process and the patterned photoresist layer as a first etch mask to form the second patterned hard mask layer.

11. The method of claim 10, wherein transferring the second line feature pattern to the dielectric layer comprises exposing a portion of the dielectric layer to a second etching process using the second patterned hard mask layer as a second etch mask to form the second metal line trench section and the interconnect-hole.

12. The method of claim 11, wherein transferring the second line feature pattern to the dielectric layer comprises removing the sidewall portion of the hard mask-forming material.

* * * * *